(12) United States Patent
Viguié et al.

(10) Patent No.: US 10,125,794 B2
(45) Date of Patent: Nov. 13, 2018

(54) PIEZOELECTRIC DAMPER SYSTEM FOR AN AXIAL TURBOMACHINE ROTOR

(71) Applicants: Techspace Aero S.A., Herstal (Milmort) (BE); Universite Libre de Bruxelles, Brussels (BE)

(72) Inventors: Régis Viguié, Waremme (DE); Damien Verhelst, Liège (BE); André Preumont, Chastre (BE); Bilal Mokrani, Brussels (BE); Renaud Bastaits, Ixelles (BE)

(73) Assignee: SAFRAN AERO BOOSTERS SA, Herstal (Milmort)

( * ) Notice: Subject to any disclaimer, the term of this patent is extended or adjusted under 35 U.S.C. 154(b) by 621 days.

(21) Appl. No.: 14/514,100

(22) Filed: Oct. 14, 2014

(65) Prior Publication Data
US 2015/0104295 A1    Apr. 16, 2015

(30) Foreign Application Priority Data
Oct. 14, 2013 (EP) ..................................... 13188506

(51) Int. Cl.
F04D 29/66 (2006.01)
F01D 25/06 (2006.01)
(Continued)

(52) U.S. Cl.
CPC ......... *F04D 29/668* (2013.01); *F04D 29/666* (2013.01); *F16F 15/005* (2013.01); *H01L 41/113* (2013.01); *F05D 2260/96* (2013.01)

(58) Field of Classification Search
CPC ........... F01D 5/26; F01D 25/04; F04D 29/668
See application file for complete search history.

(56) References Cited

U.S. PATENT DOCUMENTS

| | | | | |
|---|---|---|---|---|
| 5,005,353 A | * | 4/1991 | Acton | ..................... F01D 17/02 415/119 |
| 5,370,340 A | * | 12/1994 | Pla | .......................... F01D 25/04 181/206 |

(Continued)

FOREIGN PATENT DOCUMENTS

| | | |
|---|---|---|
| CN | 102223105 A | 10/2010 |
| FR | 2951223 A1 | 12/2011 |

(Continued)

OTHER PUBLICATIONS

Search Report dated Mar. 19, 2014 from European Patent Appl. No. 13188506.3.

(Continued)

*Primary Examiner* — Justin Seabe
(74) *Attorney, Agent, or Firm* — James E. Walton

(57) ABSTRACT

The present application relates to a rotor of a compressor or axial turbomachine comprising a vibration-damping system equipped with piezoelectric transducers distributed circularly and connected to dissipative resonant electric circuits. The circuits are closed and are equipped with a resistor and a coil. The piezoelectric transducers are divided into two sets of alternated transducers, each set being connected to a passive RLC circuit. In order to ensure a pooling of capacitances and currents thereof, the piezoelectric transducers are connected in parallel. During operation, the rotor is subjected to a turning excitation and is likely to vibrate and to deform in accordance with a modal shape with diameters with orthogonal deformation waves. The number of transducers is equal to the quadruple of the number of diameters of the mode, so as to be able to utilize the symmetrical character of this mode with diameters. The grouping of the piezoelectric transducers that deform in the same way makes (Continued)

it possible to damp the piezoelectric transducers with identical means thus pooled.

18 Claims, 3 Drawing Sheets

(51) Int. Cl.
*F16F 15/00* (2006.01)
*H01L 41/113* (2006.01)

(56) References Cited

U.S. PATENT DOCUMENTS 5,783,898 A     7/1998   Wu
6,299,410 B1 *  10/2001  Hilbert .................... F01D 5/16
                                                          415/10

FOREIGN PATENT DOCUMENTS

JP     19866166544 A    4/1986
JP     19960861295 A    3/1996

OTHER PUBLICATIONS

Office Action from CN Application No. 201410541360.2 dated Aug. 24, 2017.
Office Action from RU Application No. 2014141132/06(066659) dated Mar. 1, 2016.

* cited by examiner

PIEZOELECTRIC DAMPER SYSTEM FOR AN AXIAL TURBOMACHINE ROTOR

This application claims priority under 35 U.S.C. § 119 to European Patent Application No. 13188506.3, filed 14 Oct. 2013, titled "Piezoelectric Damper System for an Axial Turbomachine Rotor," which is incorporated herein by reference for all purposes.

BACKGROUND

1. Field of the Application

The present application relates to an axial turbomachine rotor. More specifically, the present application relates to a system for damping vibrations of an axial turbomachine rotor. More specifically, the present application relates to a system for damping vibrations of bladed wheels of an axial turbomachine rotor with a dissipative electric circuit.

2. Description of Related Art

During operation, annular heterogeneous flows pass through an axial turbomachine. In fact, any body located in an axial homogeneous flow will generate variations of aerodynamic pressure in the surrounding environment thereof, thus making the flow heterogeneous. These bodies may be, inter alia, blades, case struts, or variable discharge gates.

When a blade of a bladed rotor turns in an annular flow having such circumferential heterogeneities, each sudden variation of pressure will be considered as a punctiform excitation. The number of excitations over 360° associated with a given speed of rotation results in a particular excitation frequency. If this corresponds to a natural frequency of the rotor, the rotor will then enter into resonance in accordance with a particular mode of deformation composed of a certain number of nodal diameters.

When the bladed rotor wheel enters into resonance over a particular mode of deformation, increased vibratory levels develop. These vibratory levels will be greater, the weaker the intrinsic damping level of the structure, for example in the case of blisks or one-piece bladed drums. Such vibratory levels are to be avoided since they are associated with high stress states, which significantly reduce the fatigue life of the structure and may lead to the destruction thereof. In this context, the use of damping devices may prove indispensible in order to ensure the fatigue resistance of the bladed wheel.

Among the damping devices conceivable for the bladed turbomachine rotor wheels subjected to a diameter deformation, a shunted piezoelectric system represents an interesting solution. This is formed is a piezoelectric patch connected to a dissipative electric circuit.

Document JP19960861295 discloses a bladed rotor of which the vibrations are reduced with the aid of piezoelectric patches distributed over the periphery of said rotor. Each patch is connected to a closed circuit comprising a dissipative resistor. The operating principle lies in the existence of deformations at the same location of the piezoelectric patches, which, once deformed, generate a current dissipated by the resistors of the connected circuit. This damping method makes it possible to reduce the vibrations of a rotor and brings the same efficacy for each frequency. However, this damping method is ineffective for a vibration of strong amplitude. This system also involves providing each closed circuit with components, thus increasing mass and cost. The necessary space for installing each circuit is disadvantageous.

Although great strides have been made in the area of damping vibrations of an axial turbomachine rotors, many shortcomings remain.

DETAILED DESCRIPTION OF THE PREFERRED EMBODIMENT

Figure 1:
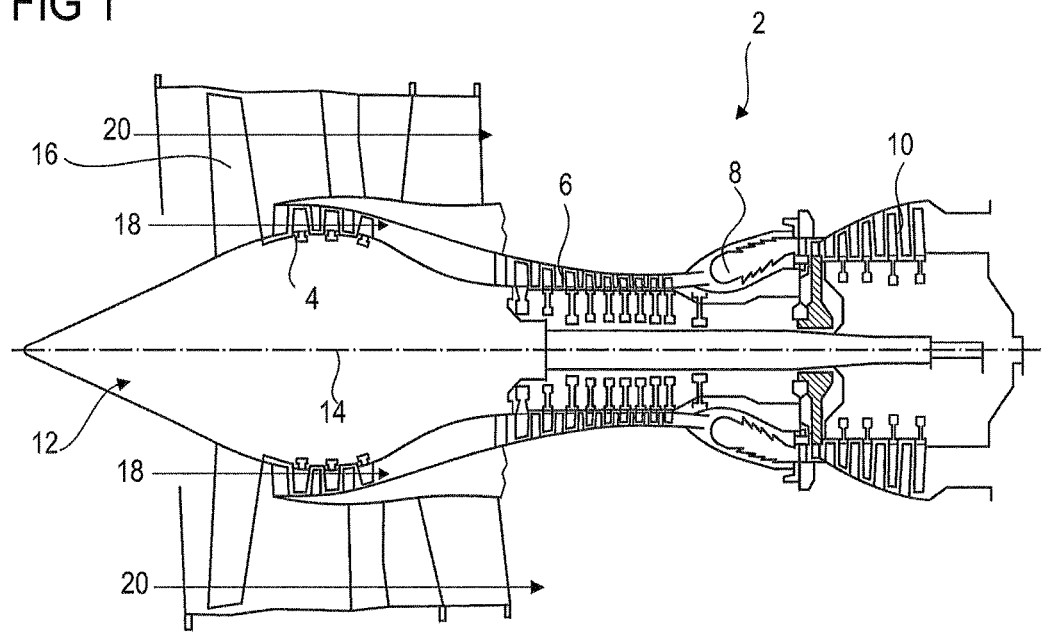
FIG. 1 shows an axial turbomachine according to the present application.

The present application aims to overcome at least one of the problems presented by the prior art. The present application improves the efficacy of a system for damping the vibration of a turbomachine rotor presenting modes with stationary or turning diameter(s). The present application also proposes a system for damping the vibration of a turbomachine rotor that can be just as effective at high frequency as at low frequency. The present application also reduces the weight of a system for damping the vibration of a turbomachine rotor.

The present application relates to a rotor, in particular of a compressor, comprising a vibration-damping system which comprises at least one set of piezoelectric transducers distributed circularly over the rotor and connected to at least one dissipative circuit, a noteworthy feature being that the piezoelectric transducers are connected so as to pool the dissipative circuit or each of the dissipative circuits with a respective set of at least two transducers connected in parallel, the transducers of the set or of each of the sets being angularly distributed homogeneously over the rotor.

The piezoelectric transducers are advantageously disposed such that each can be flexurally deformed following the deformation of the rotor at the location of the transducer in question.

In accordance with an advantageous embodiment of the present application, the rotor is able to deform under vibration in accordance with a modal shape with diameters, the number of piezoelectric transducers of the set or of each set being equal to twice the number of diameters of the modal shape.

In accordance with an advantageous embodiment of the present application, the modal shape with diameters basically comprises two orthogonal deformation waves with nodal diameters, the piezoelectric transducers being angularly distributed in each case between two adjacent nodal diameters of the two deformation waves.

The term "two adjacent nodal diameters" means two successive nodal diameters of the two deformation waves. One of the nodal diameters belongs to one of the two orthogonal deformation waves and the other of the nodal diameters belongs to the other of the two deformation waves.

In accordance with an advantageous embodiment of the present application, the damper system comprises a plurality of sets of at least two transducers each connected in parallel with a respective one of the dissipative circuits, the polarity of the connections of the transducers of each set being such that each of said transducers generates, in the respective dissipative circuit thereof, a current of identical sign when said transducers are deformed in the same direction.

In accordance with an advantageous embodiment of the present application, the damper system comprises only one set of at least two, preferably at least four, transducers connected to the dissipative circuit, the polarity of the connections of the transducers of the set being such that each of said transducers generates in said dissipative circuit a current of identical sign when said transducers are deformed in the same direction.

In accordance with an advantageous embodiment of the present application, the damper system comprises two sets of at least two transducers, said sets being angularly offset in such a way that all the transducers of all the sets are angularly distributed homogeneously over the rotor.

In accordance with an advantageous embodiment of the present application, the rotor is able to deform under vibration in accordance with a modal shape with diameters, and the damper system comprises two sets of piezoelectric transducers which are out of phase in relation to one another by a fraction of revolution equal to the inverse of the quadruple of the number of diameters of said modal shape with diameters.

In accordance with an advantageous embodiment of the present application, the dissipative circuit or at least one of the dissipative circuits comprises at least one inductor so as to form a resonant circuit with the transducers connected in parallel, the dissipative circuit or at least one of the dissipative circuits preferably basically forming a closed electric circuit in combination with the piezoelectric transducers of the corresponding set.

In accordance with an advantageous embodiment of the present application, the dissipative circuit or at least one of the dissipative circuits is free from external electrical supply.

In accordance with an advantageous embodiment of the present application, the rotor has at least one resonance frequency $\omega_R$, the dissipative circuit being a damping circuit, preferably a resonant circuit, of which the damping frequency WA is equal to the resonance frequency $\omega_R$ of the rotor to be damped.

In accordance with an advantageous embodiment of the present application, the rotor is a bladed disk or a bladed drum.

In accordance with an advantageous embodiment of the present application, the blades are formed integrally.

In accordance with an advantageous embodiment of the present application, the thickness of the piezoelectric transducers represents more than 5% of the thickness of the blades, preferably more than 30%, more preferably more than 100%.

In accordance with an advantageous embodiment of the present application, at least one of the piezoelectric transducers is disposed on a cylindrical surface or on a surface perpendicular to the axis of rotation of the rotor, preferably outside the aerodynamic flow.

In accordance with an advantageous embodiment of the present application, the transducers are disposed so as to deform under tension/compression resulting from the flexural movement of the rotor, preferably following flexural deformations of the casing of the rotor.

The present application also relates to a turbomachine comprising a rotor, a noteworthy feature being that the rotor is formed in accordance with the present application, and the rotor is preferably a rotor of a compressor or a rotor of a turbine.

In accordance with an advantageous embodiment of the present application, during operation at a critical speed, the rotor vibrates at a resonance frequency in accordance with a mode with diameters, the number of piezoelectric transducers of each set being greater than or equal to twice the number of diameters, preferably equal to four times the number of diameters, of the resonance mode.

The piezoelectric transducers are advantageously all identical.

The present application makes it possible to utilize the symmetry of deformation of a bladed rotor wheel over a given mode with diameters. By arranging piezoelectric transducers uniformly over 360°, it is possible to damp a stationary or turning vibration mode.

By grouping the piezoelectric transducers into two sets and with the control of the polarity thereof, it becomes possible to combine the capacitances thereof. The resonance frequency of an RLC circuit being expressed by $$\omega = \sqrt{\frac{1}{LC}},$$

the pooling of the capacitances will give rise to an increased equivalent capacitance. Consequently, at isofrequency, the value of inductance could be lower.

The dissipative means are pooled and are used for a number of piezoelectric transducers. The overall efficacy is enhanced and the possibilities for handling reduced frequencies are improved.

In the following description, the terms inner and outer relate to a positioning with respect to the axis of rotation of an axial turbomachine.

FIG. 1 shows an axial turbomachine. In this specific case, the turbomachine is a turbofan. The turbofan 2 comprises a first compression level, referred to as a low-pressure compressor 4, a second compression level, referred to as a high-pressure compressor 6, a combustion chamber 8 and one or more turbine levels 10. During operation, mechanical power of the turbine 10 is transmitted via the central shaft and sets in movement the two compressors 4 and 6. Gearing-down means can increase or decrease the speed of rotation transmitted to the compressors. In another embodiment, the different stages of turbines can each be connected to the compressor stages via concentric shafts. These shafts comprise a number of bladed rotor wheels separated by stator blade wheels. The rotation of the bladed rotor wheels about the axis of rotation 14 thereof thus makes it possible to generate a flow of air and to progressively compress said flow of air until entry the inlet of the combustion chamber 8.

An inlet ventilator referred to commonly as a fan 16 is coupled to the rotor 12 and generates a flow of air that is divided into a primary flow 18 passing through the different above-mentioned levels of the turbomachine and a secondary flow 20 passing through an annular conduit (shown in part) along the length of the machine so as to then re-join the primary flow at the outlet of the turbine. The primary flow 18 and secondary flow 20 are annular flows and are channelled by the casing of the turbomachine.

Figure 2:
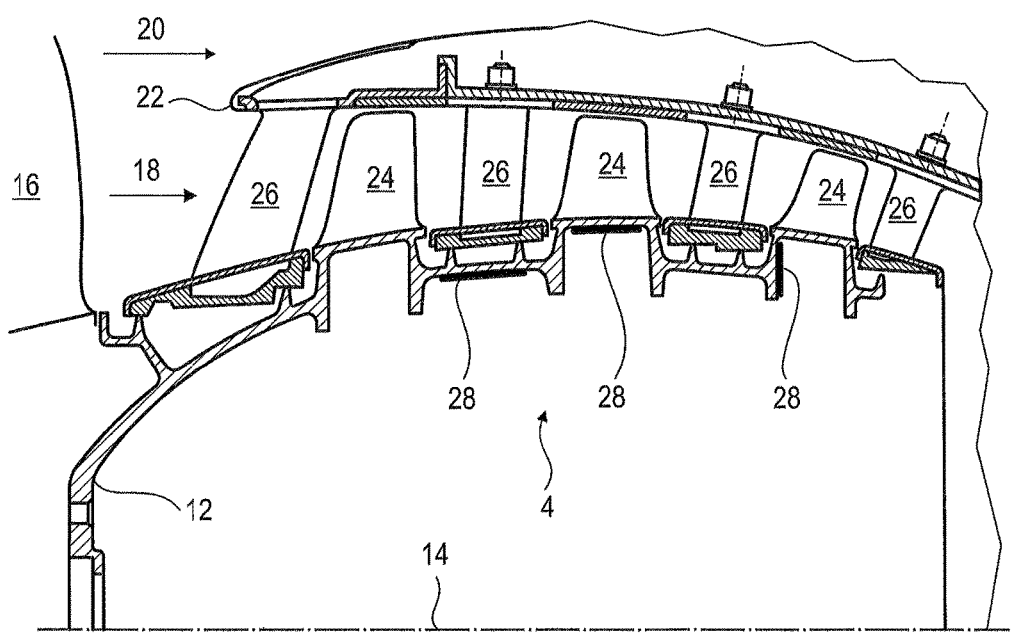
FIG. 2 is an illustration of the low-pressure compressor of the turbomachine of FIG. 1.

FIG. 2 is a sectional view of a low-pressure compressor 4 of an axial turbomachine 2 such as that in FIG. 1. Here, part of the fan 16 and the separation beak 22 of the primary flow 18 and of the secondary flow 20 can be seen. The rotor 12 comprises a number of rows of rotor blades 24, for example three. The low-pressure compressor 4 comprises a number of rows of stator blades 26, for example four. The rectifiers are associated with the fan 16 or with a row of rotor blades in order to rectify the flow of air so as to convert the speed of the flow into pressure.

The rotor part of the low-pressure compressor has a cylindrical form commonly referred to as a drum, on which the rotor blades are fixed. It comprises a substantially thin outer wall, of which the thickness can generally be less than 8.00 mm, preferably less than 5.00 mm, more preferably less than 3.00 mm. The wall of the rotor 12 may have structural surfaces extending axially and/or radially. In accordance with an alternative of the present application, the rotor may have the form of a one-piece disk with blades over the circumference thereof.

The drum and blades thereof can be made of metal material, such as titanium or aluminium. They may also be made of composite materials. They are dimensioned so as to tolerate certain levels of static stress, which can be generated by the centrifugal forces, dilation or pressure. The dimensions of the drum and blades thereof also take into account dynamic stresses generated by the vibratory responses thereof.

During operation, the rotor 12 may experience dynamic excitations, the majority of which are constituted by aerodynamic excitations. In response, the rotor will vibrate. An exciter or a specific operating speed of the turbomachine may be the source of vibration. The structure of the turbomachine can communicate the vibration of another element to the rotor 12.

The vibrations of the rotor are observed inter alia on the drum and blades thereof. The vibrations generate axial and/or radial deformations and/or circumferential deformations of the walls of the drum corresponding to a particular modal composition at a given frequency. For a blisk or a one-piece bladed drum, the structural damping remains very low. The vibratory levels and therefore the associated dynamic constraints may become problematic. In fact, the mass gain makes it necessary to thin the walls of said drum/blisk and therefore reduce the strength and rigidity thereof.

To reduce the amplitude of these vibrations, the rotor 12 comprises a vibration-damping system based on the use of piezoelectric transducers 28 connected to means for dissipating electrical energy. A piezoelectric transducer 28 or piezoelectric patch is a component comprising a piezoelectric material which is able to transform a deformation into an electric current. It thus makes it possible to convert a mechanical energy into an electrical energy. It is polarized and delivers a charge of which the sign depends on the direction of deformation thereof and orientation thereof. The piezoelectric transducers may comprise a piezoelectric composite material, for example an AFC (active fibre composite). This material can be deformed so as to allow a piezoelectric transducer to be mounted on a curved surface.

So as not to disturb the aerodynamic profile, the piezoelectric transducers 28 are not positioned on the blades, but on the available surfaces inside the drum 12, distributed uniformly over 360°. The piezoelectric transducers can be implanted on a cylindrical surface or a radial surface of the rotor 12. The rotor may have a number of assemblies of a number of sets of piezoelectric transducers 28, which are each distributed circularly.

Figure 3:
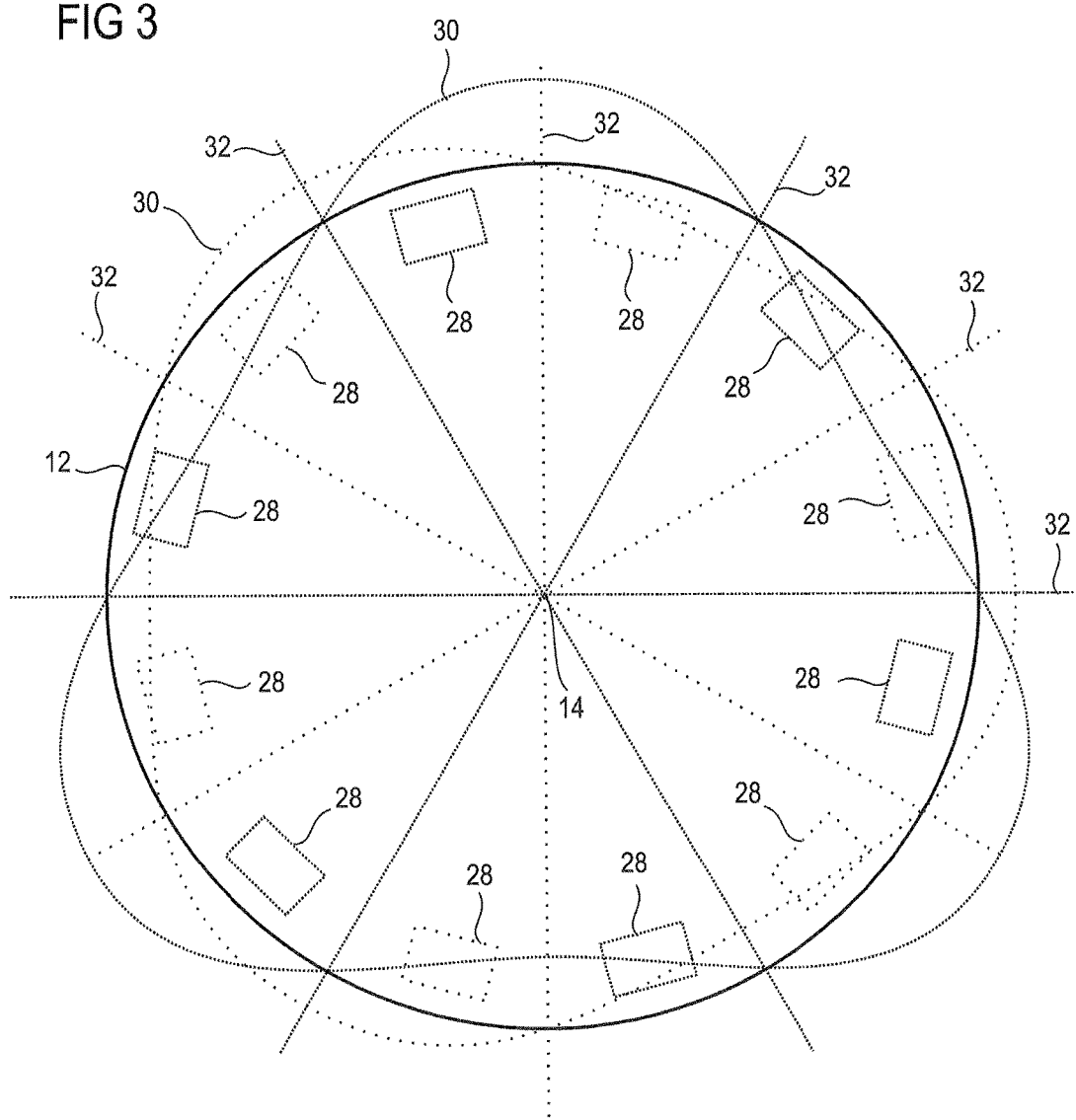
FIG. 3 shows a rotor according to the present application, deformed in accordance with a mode with diameters (three in the presented example) with two orthogonal waves.

FIG. 3 shows a rotor 12 as viewed from the front, along the axis 14. This figure shows a mode with diameters or a modal shape with diameters of the rotor 12 at an associated resonance frequency $\omega_R$. This modal shape with diameters has three diameters. The modal shape with diameters basically comprises two deformation waves 30, each of which also has the frequency $\omega_R$. The deformation waves are orthogonal to one another. They are fixed with respect to the rotor 12. The maximum deformation amplitudes of the deformation waves 30 are offset relative to one another. In theory, these maximums are equal. In reality, they may be different from one another. The modal shape corresponds to a linear combination of the two orthogonal deformation waves 30.

The modal shape materializes on the rotor 12 by a composed vibratory wave. In practice, the excitation is turning relative to the rotor 12. The modal shape will turn over the rotor 12 thanks to the combination of the two orthogonal deformation waves 30.

Due to the symmetry of the rotor 12, the phase shift of these deformation waves 30 is 90°. They each cause phase changes along the circumference of the rotor 12. The points of phase change correspond to vibration nodes, where the rotor 12 does not experience any displacement or any deformation linked to a given deformation wave. These points are aligned over diameters, referred to as nodal diameters 32 of waves distributed uniformly over 360° for a rotor 12 with cyclical symmetry. The nodal diameters 32 associated with a deformation wave 30 are shown by lines of similar nature: lines with dots arranged close to one another for one of the deformation waves and lines with dots spaced further apart for the other of the deformation waves.

The modal shape also comprises shape nodal diameters (not shown). It comprises just as many diameters as each of its shapes. The nodal diameters of the shape correspond to the locations where the deformation waves 30 cancel one another. These shape nodal diameters correspond to the points where the rotor 12 does not experience any deformation. Since the modal shape turns over the rotor, the shape nodal diameters will also turn.

In the present application, the number of diameters used corresponds to that of the modal shape. The nodal diameters of the modal shape are those that are observed physically.

On the basis of finished element calculations and on the basis of the knowledge of the orders of excitation of the structure, the excitable modal shapes with diameters are identified. The placement of the nodal diameters 32 can be determined for example depending on the placement of the rotor blades. For a blade pair number and for a modal shape having a number of diameters equal to half the number of blades, the placement of the nodal diameters 32 will be between the blades. In this case, the modal shape will also be stationary. When the modal shape has a number of diameters less than half the number of blades, the modal shape will be turning.

The damping of a modal shape with diameters can be implemented with the aid of a vibration-damping system comprising a first set of piezoelectric transducers 28. These must be positioned depending on the nodal diameters 32 so as to maximize the electromechanical coupling. They are positioned between the nodal diameters 32. This makes it possible to avoid cancelling out said transducers, since, in the opposite case, two zones of the same piezoelectric transducer could produce opposite charges. The nodal zones are to be avoided since they do not deform. The damping system may comprise a number of piezoelectric transducers 28 equal to double the number of diameters, for example in the case of a stationary modal shape.

The transducers are uniformly distributed over 360° and are similar. They describe a circle concentric with the rotor 12. Since the deformation waves 30 are out of phase, they are basically each damped in turn by the first set of piezoelectric transducers 28. The assembly of piezoelectric transducers 28 of the first set extend physically over at least half of the circumference.

So as to be able to effectively damp a turning modal shape, the vibration-damping system comprises a second set of piezoelectric transducers 28. The second set may be similar to the first set. The piezoelectric transducers 24 of the second set are disposed between those of the first set. The piezoelectric transducers 28 of the two sets are advantageously distributed uniformly over the same circle. The two sets of piezoelectric transducers 28 may possibly be disposed over axially offset circles and/or circles having different radii. In total, the damping system comprises four times more piezoelectric transducers 28 than nodal diameters 32 appearing at the resonance frequency ωR. Another benefit of the second set is that it makes it possible to avoid the amplification of a wave between the piezoelectric transducers 28 of the first set.

Whereas, for a stationary mode, the number of piezoelectric transducers of the damping system necessary would be twice the number of diameters, four times the number of diameters is required for a turning mode, since the two stationary orthogonal modes must preferably be damped.

In order to ensure an optimal control over the two orthogonal waves, the piezoelectric transducers 28 therefore cannot be positioned just at the maximum of deformation. Each piezoelectric transducer will therefore be positioned in each squaring of a deformation wave. They each occupy the majority of a squaring of deformation. In combination, the piezoelectric transducers 28 of the sets describe materially more than 20% of the circle that they describe, preferably more than 50%; even more preferably more than 90%.

This type of architecture will ensure, permanently and with the same efficacy, the control of the two orthogonal modes and therefore of the turning mode.

Figure 4:
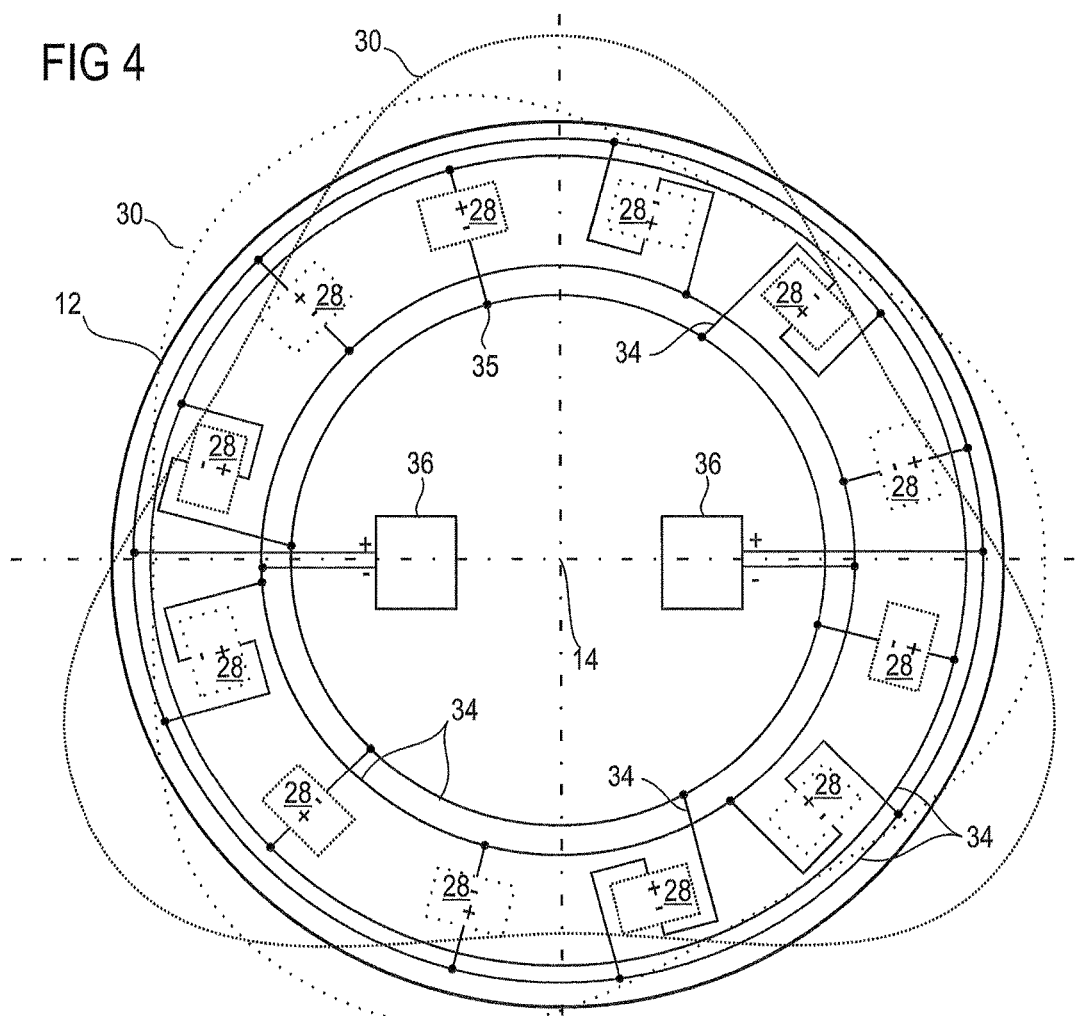
FIG. 4 shows a vibration-damping system according to the present application.

FIG. 4 shows a rotor 12 equipped with the vibration-damping system based on the use of shunted piezoelectric transducers. The present application makes it possible to define two sets of piezoelectric transducers 28 thanks to the connections. Each piezoelectric transducer is bordered directly by two piezoelectric transducers of the other set.

In accordance with the present application, the piezoelectric transducers 28 of the same set are electrically interconnected. In order to be able to pool the electrical energies thereof, they are connected in parallel. However, for each set, the two transducers directly bordering a given transducer "X" will be subjected to flexural shapes in the direction opposite to said transducer "X". Consequently, some transducers will be subjected to tension and others to compression, generating currents having different signs. In order for the currents provided by each transducer 28 of the same set to be of the same sign, the polarity of two bordering transducers will be reversed. This reversal can be performed with the aid of the electric connections or on the basis of the natural polarity of the piezoelectric material comprised by the transducer 28.

The sets of piezoelectric transducers 28 are connected with the aid of connection means 34, which may comprise wires or structuring elements of the rotor 12. The connection means 34 of the two sets can be superposed, and are advantageously electrically insulated at points of intersection or over the entire length thereof. Electrical connections 35 are provided between the connection means 34 dedicated to the same piezoelectric transducer 28 and a collector branch. The latter may describe a circle over the rotor.

In order to dissipate the vibratory energy of the rotor 12, which is present in mechanical form, each set of piezoelectric transducers 28 is connected to a common circuit 36 for dissipating electrical energy. This connection method makes it possible to pool the same dissipative circuit 36 with a number of piezoelectric transducers 28. The present application utilizes the symmetry of a mode with diameter where the sets of piezoelectric transducers 28 are each deformed symmetrically. Each set of piezoelectric transducers 28 becomes a coherent source of current with respect to a given deformation.

Figure 5:
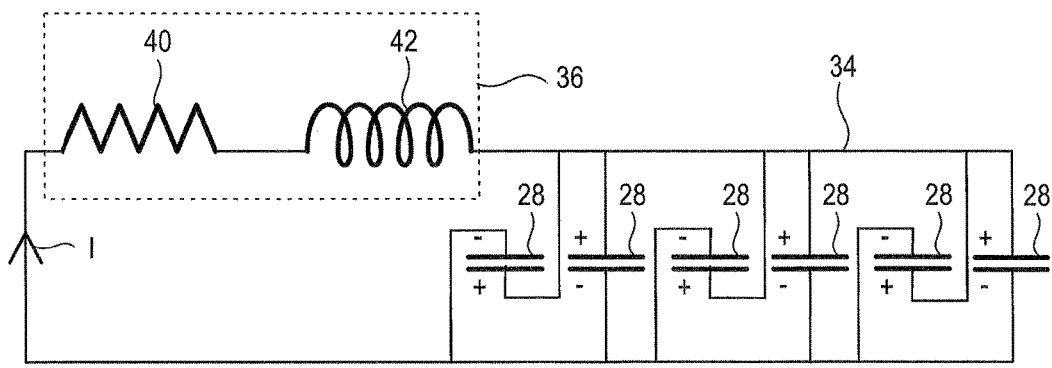
FIG. 5 shows a circuit for dissipating electrical energy according to the present application.

FIG. 5 illustrates an electric circuit for the connection of piezoelectric transducers 28. It forms a closed circuit and produces a shunt of the piezoelectric transducers 28 with the aid of the dissipative circuit 36. The dissipative circuit 36 comprises a resistor 40 for dissipating energy in the form of heat, and an inductor 42 for having a resonance of the closed circuit, making it possible to channel the energy in the circuit. The inductor may be a coil 48, preferably analogue. It is noted that an analogue coil is passive.

The dissipative circuit may comprise a number of resistors connected in series. It may also comprise a number of inductors connected in series. These same components can be integrated in the globally closed circuit, for example at connection means 34. Following an approach of the present application, the connection means 34 may have a natural resistance which is utilized in order to dissipate the energy.

The connection in parallel of the piezoelectric transducers 28 can be modelled by the connection in parallel of capacitors of capacitances C, which act on the closed circuit similarly to a single capacitor of equivalent capacitance and equal to the sum of individual capacitances, since the piezoelectric transducers 28 are connected in parallel.

The assembly of piezoelectric transducers 28 of the set, the resistor 40 and the coil 42 form a resonant and damping RLC circuit. The damping frequency $\omega_A$ thereof is dependent on the capacitance C of the circuit and the inductance L thereof. This frequency is that for which the circuit will act effectively as a damper.

This frequency is equal to:

$$\omega_A = \frac{1}{2*\pi*\sqrt{L*C}} \text{(expressed in Hz)}$$

The important vibratory levels are produced at the functioning speeds for which resonances appear between the excitation and the natural modes of the structure. The use of dampers is therefore fundamental at these speeds.

The choice of the sizes of different elements of the closed circuit is governed by the need to match the resonance frequency of the electric circuit $\omega_A$ to that of the critical mode to be damped. Thus, the rotor 12, the piezoelectric transducers 28 and the dissipative circuit 36 form an electromechanical system enabling a transformation of mechanical energy into electrical energy as well as a transfer of this mechanical energy from the bladed rotor wheel to the electric circuit enabling energy dissipation.

The present application facilitates the damping of low-frequency natural modes with the aid of shunted circuits, which may be completely passive. In fact, in the preceding formula, the resonance frequency of the electric circuit, and therefore the damping frequency, depends on the capacitance C of the circuit. The greater this capacitance, the lower will be the necessary inductance value for a given frequency. The weaker the inductance value, the smaller will be the size of the coil, which can therefore be easily integrated in the mechanical structure. In fact, the coil is a totally analogue element, by contrast with a synthetic inductor based on the principle of a gyrator. The present application thus enables a totally passive embodiment.

For a mode with N diameters, the number of piezoelectric transducers is 4N distributed into two sets of 2N transducers connected to the dedicated shunted circuit thereof. The connection in parallel of 2N transducers thus makes it possible, for a given resonance frequency, to reduce the size of the inductor of each circuit by a factor 2N with respect to a damping system in which each transducer is equipped with an inductor. In addition, only two inductors are presently necessary instead of 4N, which corresponds once again to a reduction by a factor 2N. Consequently, in total, this configuration makes it possible to reduce the overall size of the inducer by a factor $4N^2$ for the same efficacy.

We claim:

1. A turbomachine, comprising:
a compressor;
a rotation axis;
a rotor operably associate with the compressor and rotating about the rotation axis;
wherein the rotor comprises:
a vibration-damping system which comprises:
at least one electric circular wire forming a loop about the rotation axis,
at least one set of piezoelectric transducers distributed circularly about the rotor and electrically connected by the electric circular wire to at least one dissipative circuit dissipating the electric current produced by the piezoelectric transducer in order to damp vibrations of the rotor;
wherein the piezoelectric transducers are connected so as to pool the dissipative circuit or each of the dissipative circuits with a respective set of at least two piezoelectric transducers connected in parallel, the piezoelectric transducers of the set or of each of the sets being angularly distributed homogeneously over the rotor.

2. The turbomachine according to claim 1, wherein during operation at a critical speed, the rotor vibrates at a resonance frequency in accordance with a mode with diameters, the number of piezoelectric transducers of each set being greater than or equal to twice the number of diameters of the resonance mode frequency.

3. The turbomachine according to claim 1, wherein during operation at a critical speed, the rotor vibrates at a resonance frequency in accordance with a mode with diameters, the number of piezoelectric transducers of each set being greater than or equal to four times the number of diameters of the resonance mode frequency.

4. The turbomachine according to claim 1, wherein the piezoelectric transducers comprises diametrically opposite piezoelectric transducers which generate in the electrically dissipative circuit, or each of the electrically dissipative circuits, a current of identical sign when said diametrically opposite piezoelectric transducers are deformed in the same direction.

5. The turbomachine according to claim 1, wherein the rotor is deforms under vibration in accordance with a modal shape with diameters, the number of piezoelectric transducers of the set or of each set being equal to twice the number of diameters of the modal shape.

6. The turbomachine according to claim 5, wherein the modal shape with diameters comprises:
two orthogonal deformation waves with nodal diameters, the piezoelectric transducers being angularly distributed in each case between two adjacent nodal diameters of the two deformation waves.

7. The turbomachine according to claim 1, wherein the vibration-damping system comprises:
a plurality of sets of at least two piezoelectric transducers each connected in parallel with a respective one of the electrically dissipative circuits.

8. The turbomachine according to claim 1, wherein the vibration-damping system comprises:
only one set of at least two piezoelectric transducers connected to the electrically dissipative circuit, the polarity of the connections of the piezoelectric transducers of the set being such that each of said piezoelectric transducer generates in said electrically dissipative circuit a current of identical sign when said piezoelectric transducers are deformed in the same direction.

9. The turbomachine according to claim 1, wherein the vibration-damping system comprises:
only one set of at least four piezoelectric transducers connected to the electrically dissipative circuit, the polarity of the connections of the piezoelectric transducers of the set being such that each of said piezoelectric transducer generates in said electrically dissipative circuit a current of identical sign when said piezoelectric transducers are deformed in the same direction.

10. The turbomachine according to claim 1, wherein the vibration-damping system comprises:
two sets of at least two piezoelectric transducers, said sets being angularly offset in such a way that all the piezoelectric transducers of all the sets are angularly distributed homogeneously over the rotor.

11. The turbomachine according to claim 1, wherein the rotor is able to deform under vibration in accordance with a modal shape with diameters, and in that the vibration-damping system comprises:
two sets of piezoelectric transducers, which are out of phase in relation to one another by a fraction of revolution equal to the inverse of the quadruple of the number of diameters of said modal shape with diameters.

12. The turbomachine according to claim 1, wherein the electrically dissipative circuit or at least one of the electrically dissipative circuits comprises:
at least one inductor so as to form a resonant circuit with the piezoelectric transducers electrically connected in parallel, the electrically dissipative circuit or at least one of the electrically dissipative circuits forming a closed electric circuit in combination with the piezoelectric transducers of the corresponding set.

13. The turbomachine according to claim 1, wherein the electrically dissipative circuit or at least one of the electrically dissipative circuits is free from external electrical supply.

14. The turbomachine according to claim 1, wherein the rotor has at least one resonance frequency ωR, the electrically dissipative circuit being a resonant damping circuit, of which the damping frequency ωA is equal to the resonance frequency ωR of the rotor to be damped.

15. The turbomachine according to claim 1, wherein the rotor is a bladed disk.

16. The turbomachine according to claim 1, wherein the rotor is a bladed drum.

17. The turbomachine according to claim 1, wherein at least one of the piezoelectric transducers is disposed on a cylindrical surface or on a surface perpendicular to the axis of rotation of the rotor outside the aerodynamic flow.

18. The turbomachine according to claim 1, wherein the rotor includes an outer wall, the piezoelectric transducers are disposed so as to deform under tension/compression resulting from the flexural movement of the rotor following flexural deformations of the outer wall of the rotor.

\* \* \* \* \*